US012604610B2

(12) United States Patent
Chen

(10) Patent No.: US 12,604,610 B2
(45) Date of Patent: Apr. 14, 2026

(54) DISPLAY PANEL AND MANUFACTURING METHOD THEREFOR, AND DISPLAY DEVICE

(71) Applicant: BOE Technology Group Co., Ltd., Beijing (CN)

(72) Inventor: Shantao Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 630 days.

(21) Appl. No.: 17/777,793

(22) PCT Filed: Jan. 13, 2021

(86) PCT No.: PCT/CN2021/071553
§ 371 (c)(1),
(2) Date: May 18, 2022

(87) PCT Pub. No.: WO2021/169648
PCT Pub. Date: Sep. 2, 2021

(65) Prior Publication Data
US 2022/0416197 A1 Dec. 29, 2022

(30) Foreign Application Priority Data
Feb. 27, 2020 (CN) .......................... 202010124599.5

(51) Int. Cl.
*H01L 51/52* (2006.01)
*H10K 59/12* (2023.01)
(Continued)

(52) U.S. Cl.
CPC ....... *H10K 59/1201* (2023.02); *H10K 59/122* (2023.02); *H10K 59/173* (2023.02); *H10K 59/80521* (2023.02)

(58) Field of Classification Search
CPC .. H10K 50/822; H10K 59/122; H10K 59/173; H10K 59/1201
(Continued)

(56) References Cited

U.S. PATENT DOCUMENTS 6,060,728 A * 5/2000 Ghosh .................. H10K 59/173
257/94
2002/0008467 A1* 1/2002 Nagayama ........... H10K 59/173
313/506
(Continued)

FOREIGN PATENT DOCUMENTS

| CN | 104766933 A | 7/2015 |
| CN | 109935621 A | 6/2019 |

(Continued)

OTHER PUBLICATIONS

English Machine Translation of CN 110767827. (Year: 2020).*
(Continued)

*Primary Examiner* — Dzung Tran
(74) *Attorney, Agent, or Firm* — IPro, PLLC

(57) ABSTRACT

Provided are a display panel and a manufacturing method therefor, and a display device. The display panel includes: a substrate, a pixel defining layer located on the substrate, and a cathode isolation structure located on the pixel defining layer. The cathode isolation structure includes at least a first isolation sub-layer and a second isolation sub-layer located between the pixel defining layer and the first isolation sub-layer, the cross section of the second isolation sub-layer is smaller than that of the first isolation sub-layer, and an orthographic projection, on the substrate, of the second isolation sub-layer falls within an orthographic projection range, on the substrate, of the first isolation sub-layer.

14 Claims, 5 Drawing Sheets

(51) Int. Cl.
| | | |
|---|---|---|
| *H10K 59/122* | (2023.01) | |
| *H10K 59/173* | (2023.01) | |
| *H10K 59/80* | (2023.01) | |

(58) Field of Classification Search
USPC ........................................................... 257/91
See application file for complete search history.

(56) References Cited

U.S. PATENT DOCUMENTS

| | | | |
|---|---|---|---|
| 2003/0017360 A1* | 1/2003 | Tai ........................ | H10K 59/173 |
| | | | 427/66 |
| 2004/0169464 A1* | 9/2004 | Birnstock ............ | H10K 59/173 |
| | | | 313/504 |
| 2016/0104753 A1 | 4/2016 | Lee et al. | |
| 2017/0062550 A1 | 3/2017 | He et al. | |

FOREIGN PATENT DOCUMENTS

| | | |
|---|---|---|
| CN | 110767827 A | 2/2020 |
| CN | 111326675 A | 6/2020 |

OTHER PUBLICATIONS

Machine English Translation of JPH 10106747 (Year: 1998).*
CN202010124599.5 first office action.
CN202010124599.5 second office action.
CN202010124599.5 Decision of Rejection.
CN202010124599.5 Notice of Reexamination.
PCT/CN2021/071553 international search report and written opinion.

* cited by examiner

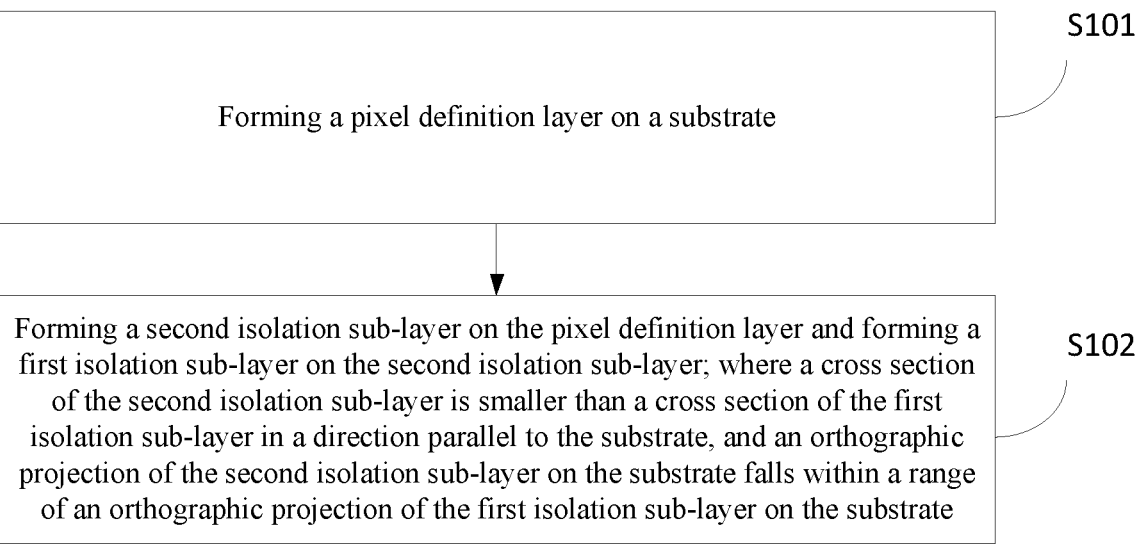

S101

Forming a pixel definition layer on a substrate

S102

Forming a second isolation sub-layer on the pixel definition layer and forming a first isolation sub-layer on the second isolation sub-layer; where a cross section of the second isolation sub-layer is smaller than a cross section of the first isolation sub-layer in a direction parallel to the substrate, and an orthographic projection of the second isolation sub-layer on the substrate falls within a range of an orthographic projection of the first isolation sub-layer on the substrate

Fig. 5

DISPLAY PANEL AND MANUFACTURING METHOD THEREFOR, AND DISPLAY DEVICE

CROSS-REFERENCE OF RELATED APPLICATIONS

The disclosure is a National Stage of International Application No. PCT/CN2021/071553, filed on Jan. 13, 2021, which claims priority to Chinese Patent Application No. 202010124599.5, filed with the China National Intellectual Property Administration on Feb. 27, 2020 and entitled "Display Panel and Manufacturing Method therefor, and Display Device", both of which are hereby incorporated by reference in their entireties.

FIELD

The disclosure relates to the field of display technology, and particularly to a display panel and a manufacturing method therefor, and a display device.

BACKGROUND

Organic Light-Emitting Diode (OLED) display products have gradually expanded the market in mobile phone display screens and television panels due to their excellent characteristics such as high contrast, short response time, high chroma, light weight and flexibility, and are known as the next-generation display technology that is most likely to replace the Liquid Crystal Display (LCD).

SUMMARY

An embodiment of the disclosure provides a display panel, including: a substrate; a pixel definition layer on a side of the substrate; a cathode isolation structure located on a side of the pixel definition layer away from the substrate, and the cathode isolation structure including: a first isolation sub-layer, and a second isolation sub-layer located between the pixel definition layer and the first isolation sub-layer, where a cross section of the second isolation sub-layer is smaller than a cross section of the first isolation sub-layer in a direction parallel to the substrate, and an orthographic projection of the second isolation sub-layer on the substrate falls within a range of an orthographic projection of the first isolation sub-layer on the substrate.

Optionally, the cathode isolation structure further includes: a third isolation sub-layer located between the pixel definition layer and the second isolation sub-layer; the cross section of the second isolation sub-layer is smaller than a cross section of the third isolation sub-layer in the direction parallel to the substrate, and the orthographic projection of the second isolation sub-layer on the substrate falls within a range of an orthographic projection of the third isolation sub-layer on the substrate.

Optionally, a center of the cross section of the first isolation sub-layer, a center of the cross section of the second isolation sub-layer and a center of the cross section of the third isolation sub-layer that are stacked coincide in the direction parallel to the substrate.

Optionally, the orthographic projection of the third isolation sub-layer on the substrate coincides with the orthographic projection of the first isolation sub-layer on the substrate.

Optionally, a thickness of the first isolation sub-layer is not less than 200 nanometers.

Optionally, materials of the first isolation sub-layer, the second isolation sub-layer and the third isolation sub-layer are different from each other.

Optionally, the material of the first isolation sub-layer and the material of the third isolation sub-layer are inorganic materials, and the material of the second isolation sub-layer is an organic material.

Optionally, the material of the first isolation sub-layer includes silicon oxide, the material of the second isolation sub-layer includes polyimide, and the material of the third isolation sub-layer includes silicon nitride.

Optionally, the display panel further includes: a cathode located on a side of the pixel definition layer and the cathode isolation structure away from the substrate; the cathode includes: a first portion located on a side of the first isolation sub-layer facing away from the substrate, and a second portion located in a region outside the cathode isolation structure, where the first portion and the second portion are disconnected from each other.

Optionally, the pixel definition layer includes a plurality of pixel openings; the display panel further includes: an anode located in the pixel openings; a light-emitting function layer located in the pixel openings and between the anode and the second portion of the cathode. In another aspect, an embodiment of the disclosure further provides a manufacturing method for a display panel, including: forming a pixel definition layer on a substrate; forming a second isolation sub-layer on the pixel definition layer and forming a first isolation sub-layer on the second isolation sub-layer; where a cross section of the second isolation sub-layer is smaller than a cross section of the first isolation sub-layer in a direction parallel to the substrate, and an orthographic projection of the second isolation sub-layer on the substrate falls within a range of an orthographic projection of the first isolation sub-layer on the substrate.

Optionally, before forming the second isolation sub-layer on the pixel definition layer, the method further includes: forming a third isolation sub-layer on the pixel definition layer; where the cross section of the second isolation sub-layer is smaller than a cross section of the third isolation sub-layer in the direction parallel to the substrate, and the orthographic projection of the second isolation sub-layer on the substrate falls within a range of an orthographic projection of the third isolation sub-layer on the substrate.

Optionally, forming the third isolation sub-layer, the second isolation sub-layer and the first isolation sub-layer on the pixel definition layer, includes: forming a whole-layer third isolation sub-layer on the pixel definition layer; forming a whole-layer second isolation sub-layer on the third isolation sub-layer; forming a whole-layer first isolation sub-layer on the second isolation sub-layer; coating photoresist on the whole-layer first isolation sub-layer; forming a pattern of the photoresist by exposure and development processes; processing the first isolation sub-layer, the second isolation sub-layer and the third isolation sub-layer by an etching process so that the orthographic projection of the third isolation sub-layer on the substrate coincides with the orthographic projection of the first isolation sub-layer on the substrate, and over-etching a side surface of the second isolation sub-layer to form a pattern of the first isolation sub-layer, a pattern of the second isolation sub-layer and a pattern of the third isolation sub-layer; removing the photoresist.

Optionally, after forming the first isolation sub-layer on the pixel definition layer, the method further includes: forming a pattern of a cathode by a sputtering process, where the cathode includes: a first portion located on a side of the first isolation sub-layer facing away from the substrate, and a second portion located in a region outside the cathode isolation structure, where the first portion and the second portion are disconnected from each other. Optionally, before forming the pixel definition layer on the substrate, the method further includes: forming a pattern of an anode on the substrate, where the pattern of the anode is located within pixel openings of the pixel definition layer to be formed; before forming the pattern of the cathode, the method further includes: forming a light-emitting function layer located on the anode in the pixel openings.

In another aspect, an embodiment of the disclosure further provides a display device, including the display panel provided in embodiments of the disclosure.

BRIEF DESCRIPTION OF THE DRAWINGS

FIG. 5 is a schematic flowchart of a manufacturing method for a display panel according to an embodiment of the disclosure;

DETAILED DESCRIPTION OF EMBODIMENTS

In order to make objects, technical solutions and advantages of the disclosure clearer, the disclosure will be further illustrated below in details with reference to the accompanying drawings. Obviously the described embodiments are a part of embodiments of the disclosure but not all embodiments. Based upon embodiments of the disclosure, all of other embodiments obtained by those ordinary skilled in the art without creative work pertain to the protection scope of the disclosure.

The shape and size of each component in the accompanying drawings do not reflect the true proportion, and are merely for purpose of schematically illustrating the content of the disclosure.

In the related art, when a patterned cathode needs to be formed in an OLED display product, an isolation pillar needs to be formed to isolate the entire cathode. For a cathode formed by the evaporation process, only an inverted trapezoidal spacer layer is required to realize the isolation of the cathode. However, with the development of various technologies, for example, the Sputter process is used to form the cathode. For example, the inverted trapezoidal spacer layer is still used. For materials with good ductility, the continuous slope of the inverted trapezoidal spacer layer cannot realize the isolation of the cathode formed by the Sputter process.

Based on the fact that the cathode formed by the Sputter process cannot be isolated by the inverted trapezoidal isolation pillar, an embodiment of the disclosure provides a novel isolation structure.

Figure 1:
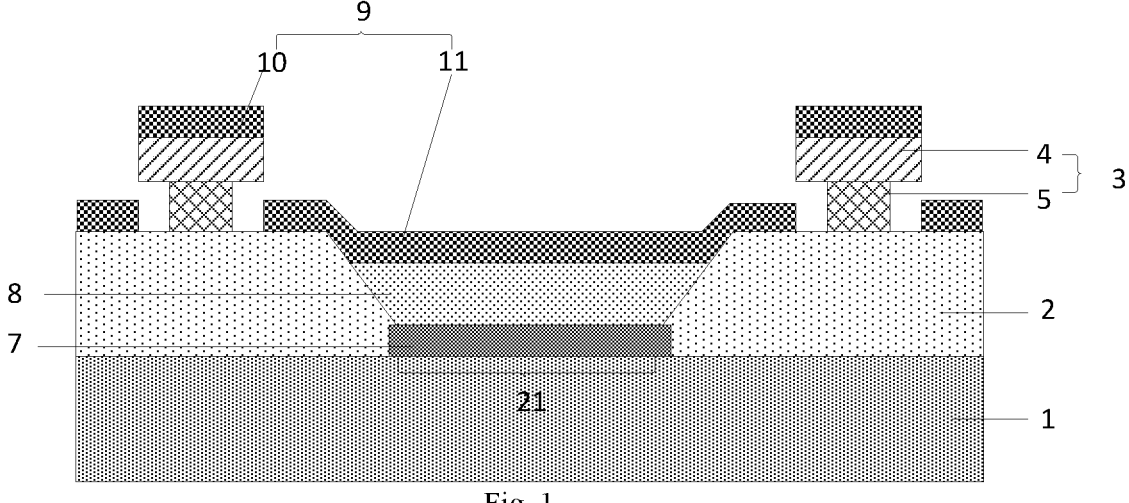
FIG. 1 is a structural schematic diagram of a display panel according to an embodiment of the disclosure.

An embodiment of the disclosure provides a display panel, and as shown in FIG. 1, the display panel includes: a substrate 1, a pixel definition layer 2 located on the substrate 1, and a cathode isolation structure 3 located on the pixel definition layer 2.

The cathode isolation structure 3 at least includes: a first isolation sub-layer 4, and a second isolation sub-layer 5 located between the pixel definition layer 2 and the first isolation sub-layer 4.

A cross section of the second isolation sub-layer 5 is smaller than a cross section of the first isolation sub-layer 4 in a direction parallel to the substrate 1, and an orthographic projection of the second isolation sub-layer 5 on the substrate 1 falls within a range of an orthographic projection of the first isolation sub-layer 4 on the substrate 1.

In the display panel provided by an embodiment of the disclosure, the cathode isolation structure 3 includes at least two isolation sub-layers: the first isolation sub-layer 4 and the second isolation sub-layer 5; and the cross section of the second isolation sub-layer 5 is smaller than the cross section of the first isolation sub-layer 4, and the orthographic projection of the second isolation sub-layer 5 on the substrate 1 falls within the range of the orthographic projection of the first isolation sub-layer 4 on the substrate 1, ensuring that the side surface of the cathode isolation structure 3 is not a continuous flat surface but the side surface of the cathode isolation structure 3 has a recessed region. After the cathode of the entire surface is formed, the cathode isolation structure 3 provided by an embodiment of the disclosure can effectively isolate the cathode to form a desired cathode pattern.

Optionally, as shown in FIG. 1, the above-mentioned display panel provided by an embodiment of the disclosure may further include: a cathode 9 located on a side of the pixel definition layer 2 and the cathode isolation structure 3 away from the substrate 1. The cathode 9 includes: a first portion 10 located on the first isolation sub-layer 4, and a second portion 11 located in a region outside the cathode isolation structure 3. The first portion 10 and the second portion 11 are disconnected from each other.

Optionally, in the above-mentioned display panel provided by an embodiment of the disclosure, as shown in FIG. 1, the pixel definition layer 2 may include a plurality of pixel openings 21. The display panel may further include: an anode 7 located in the pixel openings 21; and a light-emitting function layer 8 located in the pixel openings 21 and between the anode 7 and the second portion 11 of the cathode 9.

It should be noted that in the display panel provided by embodiments of the disclosure, the pixel definition layer 2 and the anode 7 are spaced apart and arranged in contact with each other, and the pixel definition layer 2 may cover an edge of the anode 7. Generally, on the substrate 1, the pattern of the anode 7 is formed at first, then the pattern of the pixel definition layer 2 and the pattern of the cathode isolation structure 3 are formed, and then the pattern of the light-emitting function layer and the cathode are formed.

The light-emitting function layer 8 may include an organic light-emitting layer, and may further include, but is not limited to, one or a combination of: an electron injection layer, an electron transport layer, a hole transport layer, a hole injection layer, etc. In a specific implementation, the electron injection layer is located between the cathode and the organic light-emitting layer, the electron transport layer is located between the electron injection layer and the organic light-emitting layer, the hole injection layer is located between the anode and the organic light-emitting layer, and the hole transport layer is located between the hole injection layer and the organic light-emitting layer. It should be noted that the light-emitting function layer 8 may be of the entire surface and disconnected by the cathode isolation structure 3, or as shown in FIG. 1, the FMM mask plate may be directly used to form the pattern of the light-emitting function layer 8 located in the pixel opening 21.

The cathode isolation structure 3 includes two isolation sub-layers as an example in FIG. 1 for illustration. Of course, the cathode isolation structure 3 may also include more isolation sub-layers.

Figure 2:
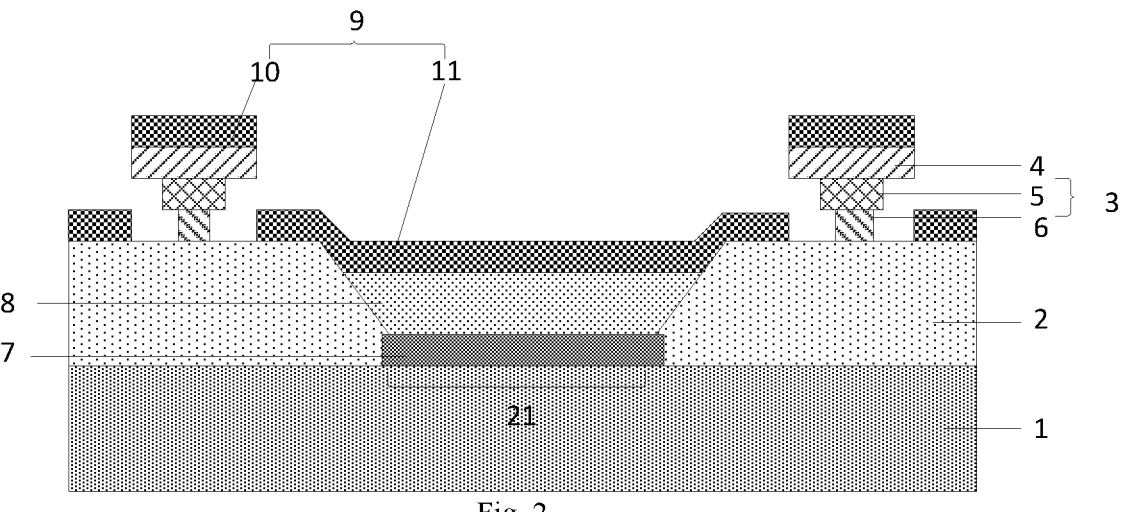
FIG. 2 is a structural schematic diagram of another display panel according to an embodiment of the disclosure.
Figure 3:
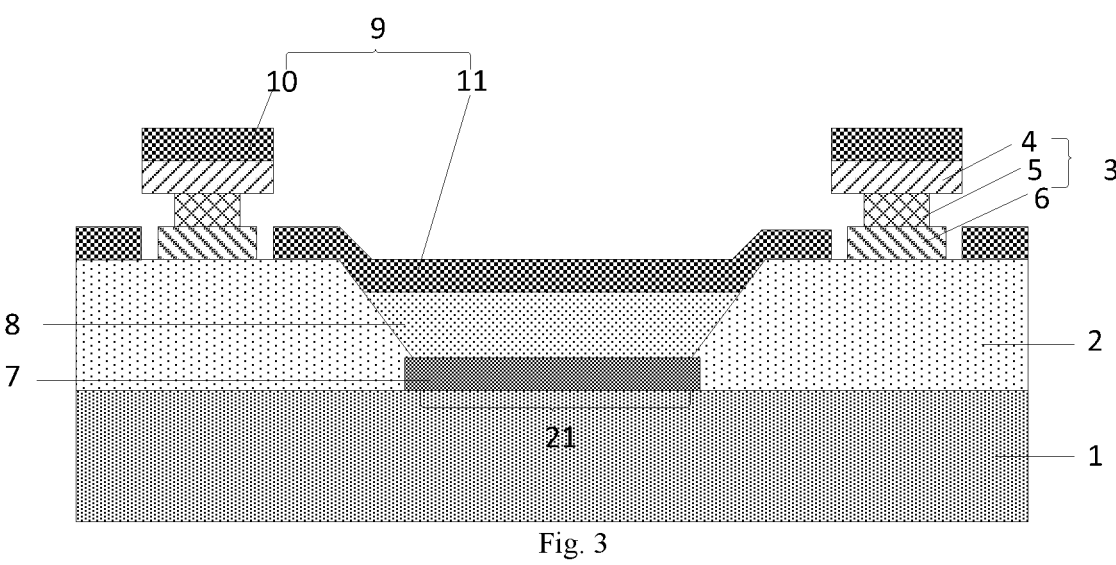
FIG. 3 is a structural schematic diagram of yet another display panel according to an embodiment of the disclosure.
Figure 4:
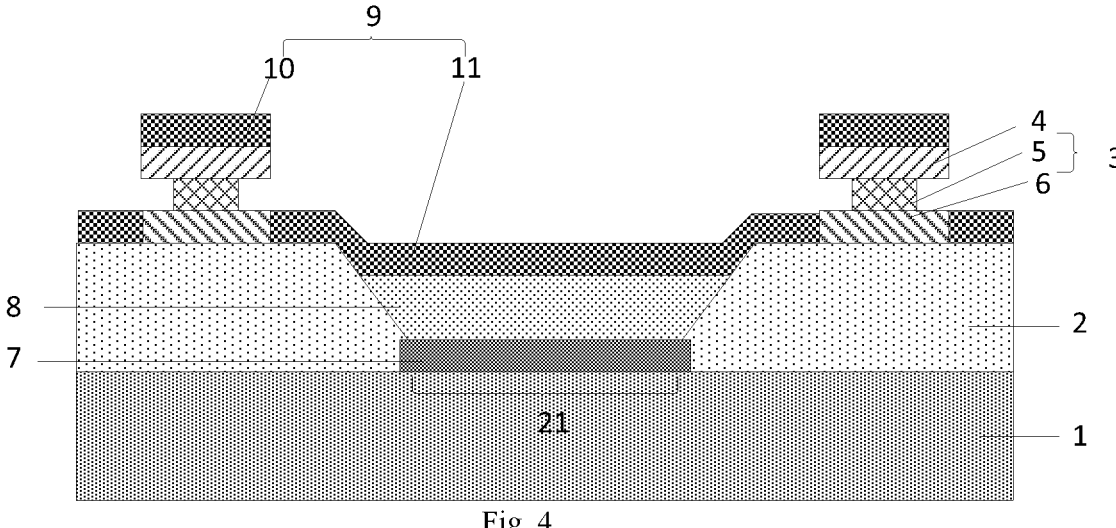
FIG. 4 is a structural schematic diagram of yet another display panel according to an embodiment of the disclosure.

Optionally, in the above-mentioned display panel provided by an embodiment of the disclosure, as shown in FIGS. 2 to 4, the cathode isolation structure 3 may further include: a third isolation sub-layer 6 located between the pixel definition layer 2 and the second isolation sub-layer 5.

Optionally, in the above-mentioned display panel provided by an embodiment of the disclosure, a center of the cross section of the first isolation sub-layer 4, a center of the cross section of the second isolation sub-layer 5 and a center of the cross section of the third isolation sub-layer 6 that are stacked may coincide in the direction parallel to the substrate 1, to ensure that the disconnected cathode pattern can be realized at each edge of the cathode isolation structure 3.

Optionally, as shown in FIG. 2, the cross sections of the third isolation sub-layer 6, the second isolation sub-layer 5 and the first isolation sub-layer 4 may be gradually increased.

Or optionally, as shown in FIGS. 3 and 4, the cross section of the second isolation sub-layer 5 may be smaller than the cross section of the third isolation sub-layer 6 in the direction parallel to the substrate, and the orthographic projection of the second isolation layer 5 on the substrate 1 falls within the range of the orthographic projection of the third isolation sub-layer 6 on the substrate 1.

Optionally, as shown in FIG. 3, the orthographic projection of the third isolation sub-layer 6 on the substrate 1 may fall within the range of the orthographic projection of the first isolation sub-layer 4 on the substrate 1, that is, the cross section of the third isolation sub-layer 6 is larger than the cross section of the second isolation sub-layer 5 and smaller than the cross section of the first isolation sub-layer 4.

Or optionally, as shown in FIG. 4, the orthographic projection of the third isolation sub-layer 6 on the substrate 1 may coincide with the orthographic projection of the first isolation sub-layer 4 on the substrate 1, that is, the cross section of the third isolation sub-layer 6 is larger than the cross section of the second isolation sub-layer 5 and equal to the cross section of the first isolation sub-layer 4.

In the display panel provided by an embodiment of the disclosure, when the cathode isolation structure 3 includes the third isolation sub-layer 6, the second isolation sub-layer 5 and the first isolation sub-layer 4, and the orthographic projection of the third isolation sub-layer 6 on the substrate 1 coincides with the orthographic projection of the first isolation sub-layer 4 on the substrate 1, it is equivalent to forming a groove on the side surface of the cathode isolation structure 3. The arrangement of the third isolation sub-layer 6 can avoid damage to the pixel definition layer 2 in the etching process of the side surface of the cathode isolation structure 3, and thus can avoid damage to the anode 7 and ensure the fabrication yield of the display panel. Also, the orthographic projections of the third isolation sub-layer 6 and the first isolation sub-layer 4 on the substrate 1 coincide, which can also simplify the fabrication process difficulty of the cathode isolation structure 3 while avoiding damage to the pixel definition layer 2.

Optionally, in the display panel provided by an embodiment of the disclosure, the thickness of the first isolation sub-layer is not less than 2000 angstroms, to ensure the sufficient segment difference to isolate the cathode pattern.

Optionally, in the display panel provided by an embodiment of the disclosure, the materials of the first isolation sub-layer 4, the second isolation sub-layer 5 and the third isolation sub-layer 6 are generally different from each other, so that the groove region of the side surface can be formed by selecting different etchants to etch different isolation sub-layers.

Optionally, in the display panel provided by an embodiment of the disclosure, the material of the first isolation sub-layer 4 and the material of the third isolation sub-layer 6 are generally inorganic materials, and the material of the second isolation sub-layer 5 is generally an organic material.

Specifically, in the display panel provided by an embodiment of the disclosure, the material of the first isolation sub-layer 4 may include silicon oxide, the material of the second isolation sub-layer 5 may include polyimide, and the material of the third isolation sub-layer 6 may include silicon nitride.

In the display panel provided by an embodiment of the disclosure, the material of the anode 7 may be, for example, Indium Tin Oxide (ITO); and the material of the cathode 9 may be, for example, ITO, silver (Ag), Indium Zinc Oxide (IZO), or other metal or metal oxide.

In the display panel provided by an embodiment of the disclosure, even if the material of the cathode 9 is selected as a metal or metal oxide with good ductility, since the side surface of the cathode isolation structure 3 is not a continuous flat surface and the side surface of the cathode isolation structure 3 has a recessed region, the cathode isolation structure 3 provided in an embodiment of the disclosure can also realize the isolation of the cathode when the cathode 9 needs to be patterned.

Based on the same inventive concept, an embodiment of the present disclosure further provides a manufacturing method for a display panel. Since the principle of the manufacturing method to solve the problem is similar to that of the above-mentioned display panel, implementations of the manufacturing method can refer to implementations of the display panel, and the repeated description thereof will be omitted.

A manufacturing method for a display panel provided by an embodiment of the disclosure, as shown in FIG. 5, includes following steps.

S101: forming a pixel definition layer on a substrate.

S102: forming a second isolation sub-layer on the pixel definition layer and forming a first isolation sub-layer on the second isolation sub-layer; where a cross section of the second isolation sub-layer is smaller than a cross section of the first isolation sub-layer in a direction parallel to the substrate, and an orthographic projection of the second isolation sub-layer on the substrate falls within a range of an orthographic projection of the first isolation sub-layer on the substrate.

In the manufacturing method for the display panel provided by an embodiment of the disclosure, a cathode isolation structure including at least two isolation sub-layers (the first isolation sub-layer and the second isolation sub-layer) is formed on the pixel definition layer, and the cross section of the second isolation sub-layer is smaller than the cross section of the first isolation sub-layer, and the orthographic projection of the second isolation sub-layer on the substrate falls within the range of the orthographic projection of the first isolation sub-layer on the substrate, so that the side surface of the cathode isolation structure is not a continuous flat surface and the side surface of the cathode isolation structure has a recessed region. Thus, when the cathode of the entire surface needs to be formed, the cathode isolation structure provided by an embodiment of the disclosure can isolate the cathode to form a desired cathode pattern.

Optionally, in the above-mentioned manufacturing method provided by an embodiment of the disclosure, before forming the second isolation sub-layer on the pixel definition layer in step S102, the method may further include: forming a third isolation sub-layer on the pixel definition layer; where the cross section of the second isolation sub-layer is smaller than a cross section of the third isolation sub-layer in the direction parallel to the substrate, and the orthographic projection of the second isolation sub-layer on the substrate falls within a range of an orthographic projection of the third isolation sub-layer on the substrate.

Optionally, in the above-mentioned manufacturing method provided by an embodiment of the disclosure, forming the third isolation sub-layer, the second isolation sub-layer and the first isolation sub-layer on the pixel definition layer, includes: forming a whole-layer third isolation sub-layer on the pixel definition layer; forming a whole-layer second isolation sub-layer on the third isolation sub-layer; forming a whole-layer first isolation sub-layer on the second isolation sub-layer; coating photoresist on the whole-layer first isolation sub-layer; forming a pattern of the photoresist by exposure and development processes; processing the first isolation sub-layer, the second isolation sub-layer and the third isolation sub-layer sequentially by an etching process so that the orthographic projection of the third isolation sub-layer on the substrate coincides with the orthographic projection of the first isolation sub-layer on the substrate, and over-etching a side surface of the second isolation sub-layer to form a pattern of the first isolation sub-layer, a pattern of the second isolation sub-layer and a pattern of the third isolation sub-layer; removing the photoresist.

In the manufacturing method for the display panel provided by an embodiment of the disclosure, after the pattern of the photoresist is formed, the pattern of the first isolation sub-layer is formed at first, and the second isolation sub-layer and the first isolation sub-layer are etched by using the pattern of the first isolation sub-layer as a mask. In a specific implementation, for example, in terms of material selection of the isolation sub-layers, the etching difficulty of the material of the second isolation sub-layer is different from that of the material of the third isolation sub-layer, and the second isolation sub-layer is easier to be etched than the third isolation sub-layer, so that the second isolation sub-layer can be over-etched on the side surface in the etching process, and finally an "I"-shaped cathode isolation structure is formed.

In the manufacturing method for the display panel provided by an embodiment of the disclosure, the arrangement of the third isolation sub-layer can avoid damage to the pixel definition layer in the etching process of the side surface of the cathode isolation structure, and thus can avoid damage to the anode and ensure the fabrication yield of the display panel. Also, the orthographic projections of the third isolation sub-layer and the first isolation sub-layer on the substrate coincide, and the pattern of the third isolation sub-layer may be formed by using the pattern of the first isolation sub-layer as a mask, which can also simplify the fabrication process difficulty of the cathode isolation structure and simplify the fabrication process complexity of the cathode isolation structure while avoiding damage to the pixel definition layer.

Optionally, in the above-mentioned manufacturing method provided by an embodiment of the disclosure, the photoresist may be a positive photoresist.

Optionally, in the above-mentioned manufacturing method provided by an embodiment of the disclosure, the thickness of the first isolation sub-layer is not less than 200 nanometers. Therefore, in the process of etching to form the pattern of the first isolation sub-layer, the pattern of the second isolation sub-layer and the pattern of the third isolation sub-layer, the damage to the pattern of the first isolation sub-layer can be avoided, and the case where the cathode isolation structure with the side surface having a recessed region cannot be subsequently formed is avoided.

In a specific implementation, in the above-mentioned manufacturing method provided by an embodiment of the disclosure, the thicknesses of the second isolation sub-layer and the third isolation sub-layer may be set according to the etching rate in the specific process, which are not limited in the disclosure.

Optionally, in the above-mentioned manufacturing method provided by an embodiment of the disclosure, before forming the pixel definition layer on the substrate in step S101, the method may further include: forming a pattern of an anode on the substrate, where the pattern of the anode is located within pixel openings of the pixel definition layer to be formed; before forming the pattern of the cathode, the method further includes: forming a light-emitting function layer located on the anode in the pixel openings.

Optionally, in the above-mentioned manufacturing method provided by an embodiment of the disclosure, after forming the first isolation sub-layer on the pixel definition layer in step S102, the method may further include: forming a pattern of a cathode by a sputtering process, where the cathode includes: a first portion located on a side of the first isolation sub-layer facing away from the substrate, and a second portion located in a region outside the cathode isolation structure, where the first portion and the second portion are disconnected from each other.

In the manufacturing method for the display panel provided by an embodiment of the disclosure, even if the material with good ductility is selected for the cathode, since the side surface of the cathode isolation structure formed is not a continuous flat surface and the side surface of the cathode isolation structure has a recessed region, the cathode isolation structure formed by the method provided by an embodiment of the disclosure can realize the isolation of the cathode when the patterned cathode is formed by the sputtering process.

Figure 6:
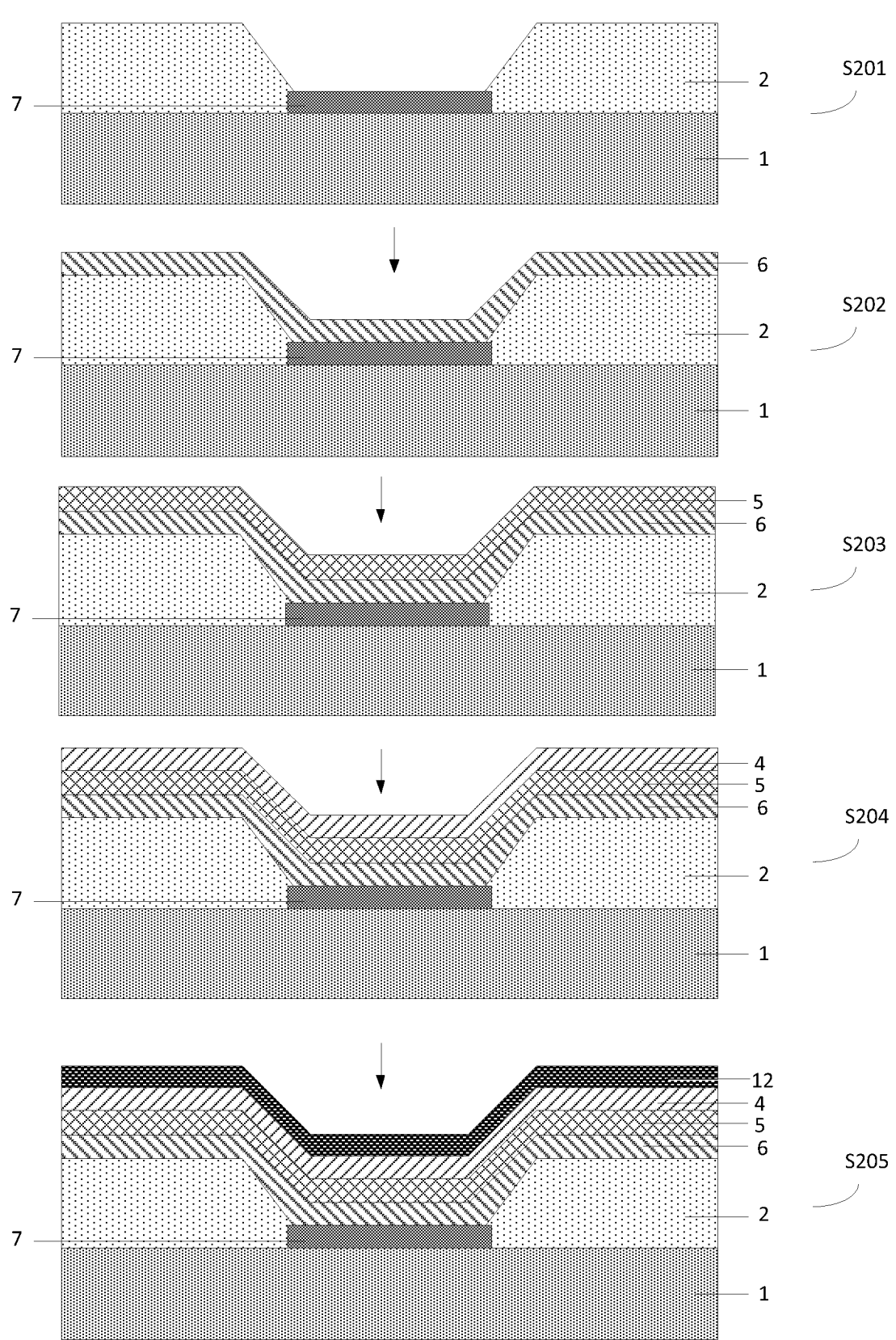
FIGS. 6 to 7 are respectively structural schematic diagrams after performing steps in another manufacturing method for a display panel according to an embodiment of the disclosure.
Figure 7:
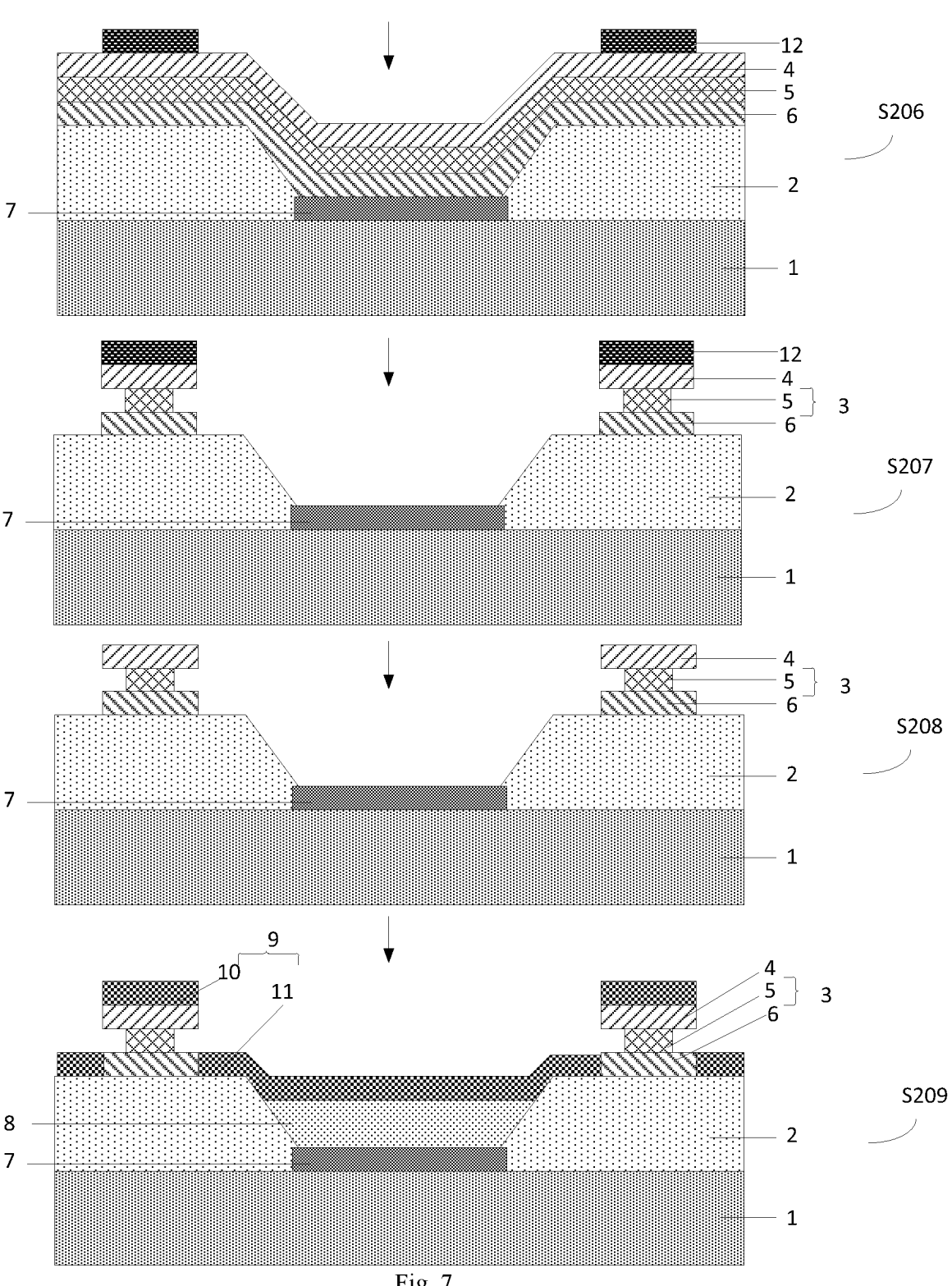

In the following, taking the cathode isolation structure including three isolation sub-layers as an example, the manufacturing method for the display panel provided by an embodiment of the disclosure will be illustrated. FIGS. 6 to 7 show the structural schematic diagrams after the steps are completed. The manufacturing method for the display panel includes following steps.

S201: forming an anode 7 and a pixel definition layer 2 on a substrate 1 in sequence.

S202: depositing a layer of silicon nitride (SiNx) on the pixel definition layer 2 and the anode 7 as a third isolation sub-layer 6.

A thickness of SiNx may be, for example, 100 nanometers (nm).

S203, coating a layer of polyimide (PI) on the third isolation sub-layer 6 as a second isolation sub-layer 5, and curing the polyimide.

A thickness of the PI may be, for example, 1000 nm.

S204: depositing a layer of silicon oxide (SiOx) on the second isolation sub-layer 5 as a first isolation sub-layer 4.

A thickness of SiOx may be, for example, 200 nm.

S205: coating a photoresist 12 on the first isolation sub-layer 4.

S206: forming a pattern of the photoresist 12 by exposure and development processes.

S207: processing the first isolation sub-layer 4 by the etching process to form a pattern of the first isolation sub-layer, and using the pattern of the first isolation sub-layer 4 as a mask to continue to process the second isolation sub-layer 5 and the third isolation sub-layer 6 by the etching process so that the orthographic projection of the third isolation sub-layer 6 on the substrate 1 coincides with the orthographic projection of the first isolation sub-layer 4 on the substrate 1, and over-etching a side surface of the second isolation sub-layer 5 to form an "I"-shaped cathode isolation structure 3.

S208: removing the photoresist 12.

S209: forming a light-emitting function layer 8 on the anode 7, and forming a pattern of a cathode 9 on the light-emitting function layer 8 by the sputtering process.

Here, the cathode 9 includes: a first portion 10 located on the first isolation sub-layer 4, and a second portion 11 located in a region outside the cathode isolation structure, and the first portion 10 and the second portion 11 are disconnected from each other.

Based on the same inventive concept, an embodiment of the disclosure further provides a display device, including the display panel provided by an embodiment of the disclosure. The display device may be: a mobile phone, a tablet, a television, a display, a laptop, a digital photo frame, a navigator, or any other product or component with display function. Implementations of this display device can refer to embodiments of the above-mentioned display panel, and the repeated description thereof will be omitted here.

To sum up, in the display panel, the manufacturing method for the same, and the display device provided by embodiments of the disclosure, the cathode isolation structure includes at least two isolation sub-layers (the first isolation sub-layer and the second isolation sub-layer), and the cross section of the second isolation sub-layer is smaller than the cross section of the first isolation sub-layer, and the orthographic projection of the second isolation sub-layer on the substrate falls within the range of the orthographic projection of the first isolation sub-layer on the substrate, so that the side surface of the cathode isolation structure is not a continuous flat surface and the side surface of the cathode isolation structure has a recessed region. Thus, when the cathode of the entire surface needs to be formed, the cathode isolation structure provided by embodiments of the disclosure can isolate the cathode to form a desired cathode pattern.

Evidently those skilled in the art can make various modifications and variations to the disclosure without departing from the spirit and scope of the disclosure. Thus the disclosure is also intended to encompass these modifications and variations to the disclosure as long as these modifications and variations come into the scope of the claims of the disclosure and their equivalents.

What is claimed is:

1. A display panel, comprising:
a substrate;
a pixel definition layer on a side of the substrate;
a cathode isolation structure located on a side of the pixel definition layer away from the substrate, and the cathode isolation structure comprising: a first isolation sub-layer, and a second isolation sub-layer located between the pixel definition layer and the first isolation sub-layer, wherein a cross section of the second isolation sub-layer is smaller than a cross section of the first isolation sub-layer in a direction parallel to the substrate, and an orthographic projection of the second isolation sub-layer on the substrate falls within a range of an orthographic projection of the first isolation sub-layer on the substrate;

wherein the cathode isolation structure further comprises: a third isolation sub-layer located between the pixel definition layer and the second isolation sub-layer;

the cross section of the second isolation sub-layer is smaller than a cross section of the third isolation sub-layer in the direction parallel to the substrate, and the orthographic projection of the second isolation sub-layer on the substrate falls within a range of an orthographic projection of the third isolation sub-layer on the substrate;

wherein a material of the first isolation sub-layer and a material of the third isolation sub-layer are inorganic materials, and a material of the second isolation sub-layer is an organic material;

wherein the material of the first isolation sub-layer comprises silicon oxide, and the material of the third isolation sub-layer comprises silicon nitride.

2. The display panel according to claim 1, wherein a center of the cross section of the first isolation sub-layer, a center of the cross section of the second isolation sub-layer and a center of the cross section of the third isolation sub-layer that are stacked coincide in the direction parallel to the substrate.

3. The display panel according to claim 1, wherein the orthographic projection of the third isolation sub-layer on the substrate coincides with the orthographic projection of the first isolation sub-layer on the substrate.

4. The display panel according to claim 1, wherein a thickness of the first isolation sub-layer is not less than 200 nanometers.

5. The display panel according to claim 1, wherein materials of the first isolation sub-layer, the second isolation sub-layer and the third isolation sub-layer are different from each other.

6. The display panel according to claim 1, wherein the material of the second isolation sub-layer comprises polyimide.

7. The display panel according to claim 1, wherein the display panel further comprises: a cathode located on a side of the pixel definition layer and the cathode isolation structure away from the substrate;

the cathode comprises: a first portion located on a side of the first isolation sub-layer facing away from the substrate, and a second portion located in a region outside the cathode isolation structure, wherein the first portion and the second portion are disconnected from each other.

8. The display panel according to claim 7, wherein the pixel definition layer comprises a plurality of pixel openings;

the display panel further comprises: an anode located in the pixel openings;

a light-emitting function layer located in the pixel openings and between the anode and the second portion of the cathode.

9. A manufacturing method for the display panel according to claim 1, comprising:
forming the pixel definition layer on the substrate;

forming the second isolation sub-layer on the pixel definition layer and forming the first isolation sub-layer on the second isolation sub-layer; wherein the cross section of the second isolation sub-layer is smaller than the cross section of the first isolation sub-layer in the direction parallel to the substrate, and the orthographic projection of the second isolation sub-layer on the substrate falls within the range of an orthographic projection of the first isolation sub-layer on the substrate.

10. The method according to claim 9, wherein before forming the second isolation sub-layer on the pixel definition layer, the method further comprises:

forming a third isolation sub-layer on the pixel definition layer; wherein the cross section of the second isolation sub-layer is smaller than a cross section of the third isolation sub-layer in the direction parallel to the substrate, and the orthographic projection of the second isolation sub-layer on the substrate falls within a range of an orthographic projection of the third isolation sub-layer on the substrate.

11. The method according to claim 10, wherein forming the third isolation sub-layer, the second isolation sub-layer and the first isolation sub-layer on the pixel definition layer, comprises:

forming a whole-layer third isolation sub-layer on the pixel definition layer;

forming a whole-layer second isolation sub-layer on the third isolation sub-layer;

forming a whole-layer first isolation sub-layer on the second isolation sub-layer;

coating photoresist on the whole-layer first isolation sub-layer;

forming a pattern of the photoresist by exposure and development processes;

processing the first isolation sub-layer, the second isolation sub-layer and the third isolation sub-layer sequentially by an etching process so that the orthographic projection of the third isolation sub-layer on the substrate coincides with the orthographic projection of the first isolation sub-layer on the substrate, and over-etching a side surface of the second isolation sub-layer to form a pattern of the first isolation sub-layer, a pattern of the second isolation sub-layer and a pattern of the third isolation sub-layer;

removing the photoresist.

12. The method according to claim 9, wherein after forming the first isolation sub-layer on the pixel definition layer, the method further comprises:

forming a pattern of a cathode by a sputtering process, wherein the cathode comprises: a first portion located on a side of the first isolation sub-layer facing away from the substrate, and a second portion located in a region outside the cathode isolation structure, wherein the first portion and the second portion are disconnected from each other.

13. The method according to claim 12, wherein before forming the pixel definition layer on the substrate, the method further comprises:

forming a pattern of an anode on the substrate, wherein the pattern of the anode is located within pixel openings of the pixel definition layer to be formed;

before forming the pattern of the cathode, the method further comprises:

forming a light-emitting function layer located on the anode in the pixel openings.

14. A display device, comprising a display panel, the display panel, comprising:

a substrate;

a pixel definition layer on a side of the substrate;

a cathode isolation structure located on a side of the pixel definition layer away from the substrate, and the cathode isolation structure comprising: a first isolation sub-layer, and a second isolation sub-layer located between the pixel definition layer and the first isolation sub-layer, wherein a cross section of the second isolation sub-layer is smaller than a cross section of the first isolation sub-layer in a direction parallel to the substrate, and an orthographic projection of the second isolation sub-layer on the substrate falls within a range of an orthographic projection of the first isolation sub-layer on the substrate;

wherein the cathode isolation structure further comprises:

a third isolation sub-layer located between the pixel definition layer and the second isolation sub-layer;

the cross section of the second isolation sub-layer is smaller than a cross section of the third isolation sub-layer in the direction parallel to the substrate, and the orthographic projection of the second isolation sub-layer on the substrate falls within a range of an orthographic projection of the third isolation sub-layer on the substrate;

wherein a material of the first isolation sub-layer and a material of the third isolation sub-layer are inorganic materials, and a material of the second isolation sub-layer is an organic material;

wherein the material of the first isolation sub-layer comprises silicon oxide, and the material of the third isolation sub-layer comprises silicon nitride.

* * * * *